United States Patent [19]
Miller et al.

[11] Patent Number: 5,897,985
[45] Date of Patent: *Apr. 27, 1999

[54] POTASSIUM SILICATE DEVELOPING COMPOSITION AND METHOD OF USE TO PROCESS LITHOGRAPHIC PRINTING PLATES

[75] Inventors: Gary Roger Miller; Janice Kay Stuber, both of Ft. Collins; Melanie Ann Felker, Loveland, all of Colo.

[73] Assignee: Kodak Polychrome Graphics, LLC, Norwalk, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/729,472

[22] Filed: Oct. 11, 1996

[51] Int. Cl.$^6$ ........................................... G03F 7/32
[52] U.S. Cl. ........................... 430/325; 430/326; 430/331
[58] Field of Search ..................... 430/331, 325, 430/326

[56] References Cited

U.S. PATENT DOCUMENTS

| | | | |
|---|---|---|---|
| 3,615,480 | 10/1971 | Lame . | |
| 4,259,434 | 3/1981 | Yamasue et al. | 430/302 |
| 4,452,880 | 6/1984 | Seino et al. | 430/309 |
| 4,469,776 | 9/1984 | Matsumoto et al. | 430/309 |
| 4,576,903 | 3/1986 | Baron et al. | 430/331 |
| 4,945,030 | 7/1990 | Turner et al. | 430/331 |
| 5,164,286 | 11/1992 | Blakeney et al. | 430/331 |
| 5,234,796 | 8/1993 | Shimura et al. | 430/331 |
| 5,250,393 | 10/1993 | Imai et al. | 430/302 |
| 5,480,762 | 1/1996 | Toyama et al. | 430/302 |

FOREIGN PATENT DOCUMENTS

| | | |
|---|---|---|
| 0 274 044A1 | 7/1988 | European Pat. Off. . |
| 0 323 836 | 7/1989 | European Pat. Off. . |
| 0 323 836 B1 | 7/1989 | European Pat. Off. . |
| 195 20 741 | 2/1996 | Germany . |
| 61-215554 | 9/1986 | Japan . |
| 1-056442 | 3/1989 | Japan . |
| 1-287561 | 11/1989 | Japan . |
| 3-228054 | 10/1991 | Japan . |
| 6-282079 | 10/1994 | Japan . |
| 2060923 | 5/1981 | United Kingdom . |

*Primary Examiner*—Christopher G. Young
*Attorney, Agent, or Firm*—Ratner & Prestia

[57] ABSTRACT

An alkaline developing composition for processing a lithographic printing plate includes an alkali metal silicate present in an amount to provide at least about 42 g $SiO_2$ per 1000 g of composition, and a weight ratio of $SiO_2$ to $M_2O$ of from about 0.55 to about 0.925 wherein M is said the metal. The lithographic printing plate can be either positive- or negative-working, and includes negative-working thermal plates.

27 Claims, No Drawings

POTASSIUM SILICATE DEVELOPING COMPOSITION AND METHOD OF USE TO PROCESS LITHOGRAPHIC PRINTING PLATES

FIELD OF THE INVENTION

This invention relates in general to lithography and in particular to aqueous alkaline, silicate-containing developing compositions useful for developing either positive-working or negative-working lithographic printing plates. It also relates to a method of using this developing composition to process imagewise exposed printing plates.

BACKGROUND OF THE INVENTION

The art of lithographic printing is based upon the immiscibility of oil and water, wherein the oily material or ink is preferentially retained by the image areas and the water or fountain solution is preferentially retained by the non-image areas of the printing plate. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and plastics. Commonly, the ink is transferred to an intermediate material called the blanket which in turn transfers the ink to the surface of the material upon which the image is to be reproduced.

Lithographic printing plates can be either negative-working or positive-working, and comprise one or more photosensitive layers on a suitable substrate, such as a metal or polymeric support. The photosensitive layer generally includes one or more photosensitive components that may be dispersed in a suitable binder. Alternatively, the photosensitive component can also be the binder material. Certain useful printing plates can be used either as positive-working or negative-working.

A negative-working printing plate generally has a light sensitive layer composed of a photosensitive component such as an unsaturated resin on a suitable substrate. Upon exposure to light, the exposed areas are hardened, leaving non-exposed areas removable during development. The exposed, hardened areas are therefore oleophilic and will accept ink while the non-exposed underlying areas of the substrate are hydrophilic.

A positive-working printing plate generally has a light sensitive layer composed of a photosensitive component such as an o-diazoquinone or an o-diazonaphthoquinone compound. Upon exposure to light the photosensitive component is converted to the corresponding carboxylic acid. The use of an alkaline developer will remove only the exposed areas of the photosensitive layer, leaving the surface of the support. Since the surface of the support is hydrophilic, the uncovered non-image area attracts water and repels the oily ink. The image area remaining after development is oleophilic, repels water and attracts the printing ink.

Various aqueous solutions are known for use as developers for both positive-working and negative-working printing plates. It is known to use a dispersion of a silicate to develop positive-working printing plates, as described, for example, in U.S. Pat. No. 4,259,434 (Yamasue et al). These solutions include alkali metal silicates, in which the ratio of $SiO_2$ to M is from 0.5 to 0.75 ("M" being the alkali metal) at about 1–4% $SiO_2$ concentration. This corresponds to a $SiO_2$ to $K_2O$ ratio of from 0.638 to 0.96 for the developer composition. The replenisher has different ratios of from 0.319 to 0.96. Moreover, the 1–4% concentration corresponds to 10–40 g $Si_2O/1000$ g of total composition. However, many of such developers are overly active and attack or remove the unexposed image on the plates. The replenishment rate of such developers is critical because the operational range of the developers is very narrow.

U.S. Pat. No. 4,452,880 (Seino et al) describes silicate-containing developers wherein the $SiO_2$ to the alkali metal oxide molar ratios are much higher, that is between 1.6 and 2.0, and the % $SiO_2$ concentration is from about 2 to about 9%, corresponding to 18.4 to 91.9 g $SiO_2/1000$ g of composition. These developers have relatively low activity, resulting in slow or incomplete development within the time necessary for practical commercial use. Thus, higher amounts of alkali hydroxide (alkali oxide) must be included. Such higher amounts can be disadvantageous due to cost, residue on the plates and the potential for clogging processing equipment.

It would be desirable to have a single developer solution that can be used for either positive-working or negative-working printing plates. Such a developer should have suitable activity (not too low or too high) within the desired processing time, and lower replenishment rates. Moreover, if replenishment is done, the replenisher should have the same composition as the developer.

SUMMARY OF THE INVENTION

The problems noted above have been solved with the use of an alkaline developing composition that is useful in developing either positive-working or negative-working lithographic printing plates, the composition having a pH of at least about 12 and comprising an alkali metal silicate present in an amount to provide at least about 42 g $SiO_2$ per 1000 g of composition, and a weight ratio of $SiO_2$ to $M_2O$ of from about 0.55 to about 0.925 wherein M is the alkali metal.

This alkaline developing composition can be used in a processing method for developing an imagewise exposed positive-working or negative-working lithographic printing plate as described in more detail below. In addition, the composition can also be used to develop both positive-working printing plates and negative-working thermal plates (that is, those exposed to heat for hardening exposed regions). These advantages allow the user to install only one machine for processing both types of plates.

This developing composition has just the desired activity for extended usefulness. It is not too active or too slow in development. Thus, the action of the developing composition at the beginning of its use is not overly aggressive, and it retains suitable activity until it is discarded. Importantly, it has a prolonged usefulness as a processing solution. Thus, the user can obtain more consistent photographic speed and image quality throughout the time the developing composition is used.

The developing composition provides greater processing latitude than conventional solutions. Moreover, it can be used as its own replenisher, thus eliminating the need for specially formulated replenishing solutions of higher activity to maintain the useful life of the processing bath. When used as a replenishing solution, the replenishment rate of the composition of this invention is generally no higher than is conventional in the art.

The advantages of this invention are provided by adjusting the amount of alkali metal silicate in the composition, as described in more detail below. Thus, the ratio of $SiO_2/M_2O$ (wherein "M" is alkali metal) and total amount of $SiO_2$ are important to provide the advantages described above.

DETAILED DESCRIPTION OF THE INVENTION

As noted above, the aqueous alkaline developing compositions of this invention include water and at least one alkali metal silicate, such as a lithium, sodium and potassium silicate. Sodium and potassium silicates are preferred and potassium silicate is most preferred. A mixture of alkali metal silicates can be used if desired.

The developing compositions contain an alkali metal silicate having a $Si_2O$ to $M_2O$ weight ratio of at least 0.55 wherein "M" is the alkali metal (such as potassium). Generally, this ratio is from about 0.55 to about 0.925. Preferably, it is from about 0.7 to about 0.925, more preferably, it is from about 0.75 to 0.925, and most preferably, it is from about 0.8 to about 0.925.

The amount of alkali metal silicate in the developing composition is generally at least about 42 grams $SiO_2$ per 1000 grams of composition, and preferably from about 42 to about 85 grams $SiO_2$/1000 grams of composition. More preferably, it is from about 42 to about 62 g $SiO_2$/1000 g of developing composition, and most preferably from about 42 to about 55 g $SiO_2$ per 1000 g of composition. Various commercial sources of silicates are known.

The developing composition has an alkaline pH that is generally at least about 12, and preferably from about 12 to about 14. In addition to the alkali silicate, alkalinity can be provided using a suitable concentration of any suitable chemical base, such as a hydroxide (for example, ammonium hydroxide, sodium hydroxide, lithium hydroxide and potassium hydroxide). Potassium hydroxide is particularly useful.

Optional components of the developing composition include one or more surfactants (anionic, nonionic and amphoteric) in a suitable amount (for example, up to 3% based on total composition weight), or a biocide (antimicrobial or antifungal agent). One or more antifoaming agents can also be included in the composition. Chelating agents, such as alkali gluconates, may also be included. Examples of useful surfactants, anti-foaming agents, biocides and chelating agents are known in the art, such as described in U.S. Pat. No. 4,259,434 (noted above). Mixtures of one or more of these addenda can also be used, if desired. In preferred embodiments, none of these materials are in the composition.

In one embodiment, a positive-working printing plate is imagewise exposed using a suitable light source, turning the exposed regions alkali soluble. Accordingly, the exposed regions are washed away with the alkaline developing composition of this invention to reveal the hydrophilic substrate underneath.

Development of a positive-working printing plate according to this invention is generally conducted at a temperature of from about 18 to about 28° C. for a period of from about 5 to about 60 seconds.

The positive-working printing plates processed in the practice of this invention are any of those conventionally used in the art. They typically include a metal or polymeric substrate, which is preferably an aluminum, aluminum alloy or treated aluminum substrate. Such substrates are well known in the art, e.g., as described in U.S. Pat. No. 4,259,434 (noted above), U.S. Pat. No. 5,122,243 (Hall) and U.S. Pat. No. 5,368,974 (Walls et al).

On the substrate is an appropriate positive-working photosensitive layer that includes a photosensitive component such as an o-diazoquinone or an o-diazonaphthoquinone compound, as described in U.S. Pat. No. 4,927,741 (Garth et al) and GB-2,082,339 (published Mar. 3, 1982).

Although these photosensitive compounds can be used alone, more typically they are dispersed in a suitable binder material (or mixture thereof) that is soluble in the alkaline developing composition. Such binder materials include, but are not limited to, novolac-type phenolic resins, and others readily apparent to one skilled in the art. Further additives can be included in the photosensitive layer composition, including dyes, plasticizers, and components that give print-out properties.

In another embodiment of this invention, a negative-working printing plate is imagewise exposed using a suitable light source, hardening the exposed regions. Accordingly, the non-exposed regions are washed away with the alkaline developing composition of this invention to reveal the hydrophilic substrate underneath. Especially useful are negative-working thermal plates that contain an infrared radiation absorbing compound, rendering the photosensitive layer infrared radiation (or heat) sensitive. Thus, a laser or other source of infrared radiation can be used to reduce solubility in exposed regions of the plate. A variety of materials are known for such plates, as described for example, in U.S. Pat. No. 5,340,699 (Haley et al), U.S. Pat. No. 5,466,557 (Haley et al) and U.S. Pat. No. 5,491,046 (DeBoer et al).

Development of a negative-working printing plate according to this invention is generally conducted at a temperature of from about 18 to about 28° C. for a period of from about 5 to about 60 seconds.

The negative-working printing plates processed in the practice of this invention typically include a metal or polymeric substrate, as described above for the positive-working plates.

On the substrate is an appropriate negative-working photosensitive layer that includes a photosensitive component, such as a novolac or resole resin, or both. Such materials as well known in the art, as evidenced by the teaching in U.S. Pat. No. 5,372,907 (Haley et al). Further additives can be included in the photosensitive layer composition, including dyes, plasticizers, Bronstad acid precursors, sensitizers, stabilizers, surfactants, and components that give printout properties, as are also well known in the art.

One preferred embodiment of this invention is an aqueous alkaline developing composition that is useful in developing either positive-working lithographic printing plates or negative-working thermal lithographic printing plates, the composition having a pH of from about 12 to about 14 and comprising:

a) potassium silicate in an amount to provide from about 42 to about 55 g $SiO_2$ per 1000 g of composition, and a weight ratio of $SiO_2$ to $K_2O$ of from about 0.8 to about 0.925, and b) optionally, one or more surfactants, anti-foaming agents, biocides or chelating agents.

The following examples are intended to illustrate the practice of this invention, and not to limit it in any way. All percentages are by weight, unless otherwise indicated.

MATERIALS AND METHODS FOR EXAMPLES

The developing compositions were formulated with a $SiO_2/K_2O$ ratio of 2.1, which ratio could be adjusted by the addition of potassium hydroxide. The amount of $SiO_2$ was adjusted by the addition of water. The Control compositions and the invention compositions below, were formulated to have various $SiO_2/K_2O$ ratios and $SiO_2$ concentrations.

Each developing composition was sealed in a water tight container and submerged in a temperature controlled (25° C.) water bath to simulate a constant processing temperature. After the composition temperature had equilibrated, a cotton swab was dipped into it, and then lightly wiped across the surface of the imagewise exposed lithographic printing plates (described below). The plates were hand processed to assure constant temperature.

Positive-working printing plates were imagewise exposed to 172 units on a standard exposing frame before development. Thermal negative-working printing plates were imagewise exposed for 110 units, baked at 135° C. in an oven having a baking section 0.6 meter long and a conveyor speed of 0.9 m/min before development.

The test object used for exposure contained a conventional UGRA scale to evaluate dot reproduction and resolution, and a T-14 wedge for evaluating relative speed.

Development times were as follows: positive-working plates=20 seconds, negative-working thermal plates=45 seconds. Because the development section of the processor is about 0.3 m in length, a cleanout time of 15 seconds would correspond to a processing speed of 1.3 m/min, a cleanout time of 20 seconds would correspond to a processing speed of 0.9 m/min, and a cleanout time of 60 seconds would correspond to a processing speed of 0.3 m/min. After development, each plate was rinsed and dried in a conventional manner.

The positive-working printing plates used in the examples are commercially available as KODAK™ Production Series Printing Plate/Web Publication LRP. The negative-working thermal printing plates used in the examples are commercially available as KODAK™ DIRECT IMAGE Thermal Printing Plate/830.

Performance of the developer compositions was determined by evaluating processed printing plates for several performance characteristics: Dmax, Dmin, "open step" reproduced on the plate after exposure through a T-14 scale, "solid step" reproduced on the plate after exposure through a T-14 scale, "ghost step" reproduced on the plate after exposure through a T-14 scale, positive microlines, negative microlines and cleanout time.

For the positive-working plates, the following are the "acceptable" and "optimal" performance characteristics:

Dmax: Acceptable=116–122
  Optimal=117–120
Dmin: Acceptable=33 or 34
Open step: Acceptable=$\geq 0.5$
  Optimal=2.5 or 3.0
Solid step: Acceptable=$\leq 14.5$
  Optimal=4–13
Positive microlines: Acceptable=4–6
Negative microlines: Acceptable=4–6
Cleanout time: Acceptable=$\leq 20$ seconds.

For the negative-working thermal plates, the following are the "acceptable" and "optimal" performance characteristics:

Dmax: Acceptable=95–101
Dmin: Acceptable=28–31
Solid step: Acceptable=$\geq 0.5$
  Optimal=2.5–13
Ghost step: Acceptable=$\leq 14$
  Optimal=6–13
Positive microlines: Acceptable=7–10
  Optimal=4–6
Negative microlines: Acceptable=7–10
  Optimal=4–6
Cleanout time: Acceptable=$\leq 60$ seconds
  Optimal=$\leq 20$ seconds.

Performance of each developing composition was then evaluated by considering the noted characteristics of each developed plate at four levels:

"optimal performance" (all characteristics were in the optimal ranges noted above) was rated a "1", "good performance" (all characteristics but one or two were in optimal ranges and those outside those ranges were close to the limits) was rated a "2", "functional performance" (all characteristics in acceptable ranges, but most outside optimal ranges) was rated a "3", and "poor performance" (most characteristics outside acceptable ranges) was rated a "4".

EXAMPLES 1–3

Alternative Developing Compositions

Three developer compositions of the present invention were prepared by mixing the following components. KASIL 2130 is a potassium silicate dispersion with a $SiO_2/K_2O$ weight ratio of 2.1, supplied by PQ Corporation.

| Component | Example 1 | Example 2 | Example 3 |
| --- | --- | --- | --- |
| Water | 653.41 g | 737.36 g | 722.30 g |
| KASIL 2130 | 296.24 g | 220.94 g | 233.70 g |
| KOH (90%) | 50.35 g | 41.70 g | 44.00 g |
| $SiO_2/K_2O$ ratio | 0.90 | 0.85 | 0.85 |
| $SiO_2$ g/1000 g | 60.00 | 44.90 | 47.49 |

For Example 1, the results from processing the positive-working printing plate provided optimal performance for all characteristics except the positive microlines were slightly high (a "2" rating). The results from processing the negative-working thermal plate were all optimal (a "1" rating).

The Example 2 and 3 compositions provided optimal performance with both types of plates (a "1" rating).

Example 2 is a preferred composition of this invention.

COMPARISON EXAMPLES

Several developing compositions were prepared like those described in the art, that is within the teaching of U.S. Pat. No. 4,259,434 and U.S. Pat. No. 4,452,880 (noted above). These compositions had the following components and properties:

| Component | Control A | Control B | Control C | Control D |
| --- | --- | --- | --- | --- |
| Water | 781.47 g | 669.49 g | 770.84 g | 741.30 |
| KASIL 2130 | 195.84 g | 296.24 g | 195.84 g | 195.84 |
| KOH (90%) | 22.69 g | 34.28 g | 41.83 g | 62.86 |
| $SiO_2/K_2O$ ratio | 1.10 | 1.10 | 0.90 | 0.60 |
| $SiO_2$ g/1000 g | 39.80 | 60.20 | 39.80 | 39.80 |

Of the foregoing comparison formulations, Controls A and B are within the teaching of U.S. Pat. No. 4,452,880, and Controls C and D are within the teaching of U.S. Pat. No. 4,259,434. Printing plates were prepared from these formulations and processed as described above. The results of evaluations of these plates using the performance characteristics are shown below. As can be seen, most of the plates exhibited merely "functional" or "poor" overall performance. None of the formulations were useful on both types of plates.

| Formulation | "Rating" | |
| --- | --- | --- |
|  | Positive-working | Thermal Negative-working |
| Control A | 4 | 4 |
| Control B | 2 | 4 |
| Control C | 2 | 4 |
| Control D | 4 | 3 |

The invention has been described in detail with particular reference to preferred embodiments thereof, but it will be understood that variations and modifications can be effected within the spirit and scope of the invention.

We claim:

1. An aqueous alkaline developing composition that is useful in developing either positive-working or negative-working lithographic printing plates, said composition having a pH of at least about 12, and consisting of potassium silicate present in an amount to provide from 42 to about 85 g $SiO_2$ per 1000 g of composition, and a weight ratio of to $K_2O$ of from about 0.8 to about 0.925, potassium hydroxide, and optionally, a surfactant, an anti-foaming agent, a chelating agent, a biocide, or mixtures thereof.

2. The composition of claim 1 having a pH of from about 12 to about 14.

3. The composition of claim 1 wherein said potassium silicate is present in an amount to provide from 42 to about 62 g $SiO_2$ per 1000 g of composition.

4. The composition of claim 3 wherein said potassium silicate is present in an amount to provide from 42 to about 55 g $SiO_2$ per 1000 g of composition.

5. The aqueous alkaline developing composition of claim 1 wherein said composition consists of the potassium silicate and the potassium hydroxide.

6. The aqueous alkaline developing composition of claim 1 wherein said composition consists of the potassium silicate, the potassium hydroxide and the surfactant.

7. The aqueous alkaline developing composition of claim 1 wherein said composition consists of the potassium silicate, the potassium hydroxide and the anti-foaming agent.

8. The aqueous alkaline developing composition of claim 1 wherein said composition consists of the potassium silicate, the potassium hydroxide and the chelating agent.

9. The aqueous alkaline developing composition of claim 1 wherein said composition consists of the potassium silicate, the potassium hydroxide and the biocide.

10. The aqueous alkaline developing composition of claim 1 wherein said composition consists of the potassium silicate, the potassium hydroxide, the surfactant and the anti-foaming agent.

11. The aqueous alkaline developing composition of claim 1 wherein said composition consists of the potassium silicate, the potassium hydroxide, the surfactant and the chelating agent.

12. The aqueous alkaline developing composition of claim 1 wherein said composition consists of the potassium silicate, the potassium hydroxide, the surfactant and the biocide.

13. The aqueous alkaline developing composition of claim 1 wherein said composition consists of the potassium silicate, the potassium hydroxide, the anti-foaming agent and the chelating agent.

14. The aqueous alkaline developing composition of claim 1 wherein said composition consists of the potassium silicate, the potassium hydroxide, the anti-foaming agent and the biocide.

15. The aqueous alkaline developing composition of claim 1 wherein said composition consists of the potassium silicate, the potassium hydroxide, the chelating agent and the biocide.

16. The aqueous alkaline developing composition of claim 1 wherein said composition consists of the potassium silicate, the potassium hydroxide, the surfactant, the anti-foaming agent and the chelating agent.

17. The aqueous alkaline developing composition of claim 1 wherein said composition consists of the potassium silicate, the potassium hydroxide, the surfactant, the anti-foaming agent and the biocide.

18. The aqueous alkaline developing composition of claim 1 wherein said composition consists of the potassium silicate, the potassium hydroxide, the surfactant, the chelating agent and the biocide.

19. The aqueous alkaline developing composition of claim 1 wherein said composition consists of the potassium silicate, the potassium hydroxide, the anti-foaming agent the chelating agent, and the biocide.

20. The aqueous alkaline developing composition of claim 1 wherein said composition consists of the potassium silicate, the potassium hydroxide, the surfactant, the anti-foaming agent, the chelating agent and the biocide.

21. A method for processing comprising:
developing an imagewise exposed positive-working or negative-working lithographic printing plate with an aqueous alkaline developing composition having a pH of at least about 12, and consisting of potassium silicate present in an amount to provide from 42 to about 85 g $SiO_2$ per 1000 g of composition, and a weight ratio of $SiO_2$ to $K_2O$ of from about 0.8 to about 0.925, potassium hydroxide, and optionally, a surfactant, an anti-foaming agent, a chelating agent, a biocide, or mixtures thereof.

22. The method of claim 21 wherein said printing plate comprises a metal or polymeric substrate, having thereon a positive-working or negative-working photosensitive composition comprising a photosensitive component.

23. The method of claim 22 wherein said printing plate is a positive-working printing plate, and has an aluminum or treated aluminum substrate having thereon a positive-working photosensitive composition, said positive-working photosensitive composition comprising an o-diazonaphthoquinone as the photosensitive component.

24. The method of claim 22 wherein said printing plate is a negative-working printing plate, and has an aluminum or treated aluminum substrate having thereon a negative-working photosensitive composition.

25. The method of claim 22 wherein said printing plate is a negative-working, thermal printing plate, and has an aluminum or treated aluminum substrate having thereon a negative-working photosensitive composition, said photosensitive composition also including an infrared radiation absorbing compound.

26. The method of claim 25 wherein said negative-working photosensitive composition also comprises a novolak resin.

27. A method for processing comprising developing an imagewise exposed thermal printing plate with an aqueous alkaline developing composition having a pH of at least about 12, and consisting of potassium silicate present in an amount to provide from 42 to about 85 g $SiO_2$ per 1000 g of composition, and a weight ratio of to $K_2O$ of from about 0.8 to about 0.925, potassium hydroxide and optionally, a surfactant, an anti-foaming agent, a chelating agent a biocide, or mixtures thereof.

* * * * *